(12) United States Patent
Ma et al.

(10) Patent No.: US 6,182,884 B1
(45) Date of Patent: Feb. 6, 2001

(54) METHOD AND APPARATUS FOR REWORKING CERAMIC BALL GRID ARRAY OR CERAMIC COLUMN GRID ARRAY ON CIRCUIT CARDS

(75) Inventors: Wai Mon Ma, Poughkeepsie; James J. Petrone, Hyde Park, both of NY (US)

(73) Assignee: International Business Machines Corporation, Armonk, NY (US)

(*) Notice: Under 35 U.S.C. 154(b), the term of this patent shall be extended for 0 days.

(21) Appl. No.: 09/208,794

(22) Filed: Dec. 10, 1998

(51) Int. Cl.⁷ .............................. B23K 31/02; B23K 1/018
(52) U.S. Cl. .......................... 228/119; 228/20.1; 228/252; 228/264
(58) Field of Search .................... 228/106, 119, 228/252, 264, 125, 19, 44.7, 6.2, 20.1

(56) References Cited

U.S. PATENT DOCUMENTS

| | | | |
|---|---|---|---|
| 4,659,004 | * 4/1987 | Fridman | 228/6.2 |
| 4,696,096 | * 9/1987 | Green et al. | 29/829 |
| 4,720,035 | 1/1988 | Isogai . | |
| 4,787,548 | * 11/1988 | Abbagnaro et al. | 228/6.2 |
| 4,858,820 | * 8/1989 | Kent | 228/264 |
| 4,962,878 | * 10/1990 | Kent | 228/47 |
| 4,972,990 | * 11/1990 | Abbagnaro et al. | 228/20 |
| 5,207,372 | 5/1993 | Funari et al. . | |
| 5,222,649 | 6/1993 | Funari et al. . | |
| 5,419,481 | 5/1995 | Lasto et al. . | |
| 5,553,768 | 9/1996 | Lasto et al. . | |
| 5,560,531 | * 10/1996 | Ruszowski | 228/19 |
| 5,715,592 | * 2/1998 | Mori et al. | 29/762 |
| 5,890,646 | * 4/1999 | Tang et al. | 228/180.21 |

* cited by examiner

*Primary Examiner*—Patrick Ryan
*Assistant Examiner*—Kiley Stoner
(74) *Attorney, Agent, or Firm*—DeLio & Peterson LLC; John J. Tomaszewski; Aziz M. Ahsan

(57) ABSTRACT

A nozzle is provided for the reworking of printed circuit boards with CBGA and CCGA solder containing chips comprising a housing having an internal hot gas chamber and configured to hold at the lower end of the nozzle a chip to be attached to the printed circuit board. The nozzle is provided with a support member and resilient means on the lower surface thereof which resilient means contacts the upper surface of the chip when the chip is placed in the nozzle. When a vacuum is applied to the nozzle the chip is held against the resilient means and compresses the resilient means so that the lower portion of the solder array is below the lower end of the nozzle. When the nozzle is then placed against a printed circuit board, the resilient means provides a pressure force against the chip and the printed circuit board which enables rework of the printed circuit board even though the printed circuit board may be warped.

7 Claims, 2 Drawing Sheets

METHOD AND APPARATUS FOR REWORKING CERAMIC BALL GRID ARRAY OR CERAMIC COLUMN GRID ARRAY ON CIRCUIT CARDS

BACKGROUND OF THE INVENTION

1. Field of the Invention

This invention relates generally to electrically and mechanically interconnecting one electronic component to another electronic component to form an electronic assembly and, in particular, to the rework of ceramic ball grid array (CBGA) and ceramic column grid array (CCGA) assemblies whereby a new chip is soldered to a printed circuit board which has been reworked by the removal of a defective chip from the board and the board became warped in the rework process.

2. Description of Related Art

Forming an electronic package assembly whereby an electrical component such as an integrated circuit chip is electrically and mechanically connected to a substrate such as a card, or board, another chip or another electronic part is well-known in the art. This technology is generally termed surface mount technology (SMT) and has gained acceptance as the preferred means of joining electronic package assemblies. in one particular application, to which this application is directed to for convenience, multilayer ceramic components, as exemplified by integrated circuit chips, are joined to printed circuit cards or boards which boards have been reworked by removing defective or unwanted chips and which boards are warped due to the rework process.

Multilayer ceramic electronic components are typically joined to printed circuit boards by soldering pads on a surface of one of the electronic components to corresponding pads on the surface of the other component. Control Collapse Chip Connection is an interconnect technology developed by IBM as an alternative to wire bonding. This technology is generally known as C4 technology or flip chip packaging. Broadly stated, an integrated circuit chip is mounted above a board and pads on the chip are electrically and mechanically connected to corresponding pads on the board by a plurality of electrical connections such as solder bumps. The integrated circuit chips may be assembled in an array such as 10×10 array.

In the C4 interconnect technology, a relatively small solder bump is attached to the pads on one of the components being joined typically to the chip. The electrical and mechanical interconnects are then formed by positioning the corresponding pads on the board to be joined adjacent the solder bumps on the chip and reflowing the bumps at an elevated temperature. The C4 joining process is self-aligning in that the wetting action of the solder will align the chip bump pattern to the corresponding board pads.

A myriad of solder structures have been proposed for the surface mounting of one electronic structure to another. Typical surface mount processes form the solder structures by screening solder paste on conductive, generally metallic pads exposed on the surface of the first electronic structure or substrate. A stencil printing operation is used to align the contact mask to the pads. The solder paste is reflowed in an inert atmosphere and homogenizes the pad and brings the solder into a spherical shape. The solder spheres on the substrate are then aligned to corresponding pads on the electronic structure or board to be connected thereto. After alignment, the substrate and board go through a reflow operation to melt the solder and create a solder bond between the corresponding pads on the substrate and other electronic component. The interconnection is typically in a form of a double truncated sphere and is termed a ceramic ball grid array (CBGA).

Other known surface mount technology uses different solder connecting structures. By using solder balls, for example, a more exact and somewhat greater quantity of solder can be applied than from screening. The solder balls are aligned and are held to a substrate and melted to form a solder joint on a conductive pad of the substrate. As before, the substrate with the newly joined solder balls is aligned to the board to be connected therewith and the solder balls are then reflowed to form a solder bond between the two substrates. The use of a copper ball surrounded by eutectic solder is also used as a solder joint structure for attaching a multilayer ceramic (MLC) substrate to a PC laminate where the ball serves as a standoff. Solder columns are also used to form solder interconnections as is well-known in the art and are generally termed a ceramic column grid array (CCGA).

A variety of soldering/desoldering machines are known for attachment and detachment of electrical circuit components particularly from areas of crowded printed circuit boards where the components are adjacent to other closely-spaced soldered components which are not to be disturbed. As shown in U.S. Pat. No. 5,553,768, which patent is hereby incorporated by reference, an improved process and apparatus is provided including an improved gas nozzle device which senses and regulates the soldering and desoldering of electrical circuit components to a printed circuit board. In general, a vacuum gas nozzle is used for holding an electrical component (chip) parallel relative to a printed circuit board (PCB) surface and directing hot gas downwardly through slots in the nozzle against solder bumps on the chip and corresponding solder pads on the PCB. The hot gas melts the solder to permit the attachment or detachment, as desired, of the component relative to the PCB surface. In the '768 patent, the vacuum gas nozzle has been improved by controlling parameters such as the temperature and/or flow rate of the hot gas supply in order to control the melt conditions and dwell time and optimize the soldering/desoldering operation.

The present invention is particularly directed to the reworking of ceramic ball grid array (CBGA) and ceramic column grid array (CCGA) containing chips on printed circuit boards wherein an existing printing circuit board containing one or more chips is reworked by heating the printed circuit board to a temperature sufficient to remove one or more of the chips connected to the circuit board. Temperatures of 195–220° C. are typically used to melt the solder connections to remove the chip to be replaced. Typically, the glass transition temperature (Tg) of a conventional FR4 printed circuit board is about 130° C. and for some high FR4 Tg materials is about 170° C. Above the glass transition temperature the FR4 board material becomes soft and warpage of the board is induced at the site on the printed circuit board where the chip was removed. To rework the printed circuit board by replacing the removed chip with a new chip, the new chip will typically not conform to a severely warped site that is warped by more than 2 mils. Accordingly, if the site on the printed circuit card or board has a warpage of more than about 2 mils the board cannot be reworked or repaired.

Bearing in mind the problems and deficiencies of the prior art, it is therefore an object of the present invention to provide a method of joining a chip or other such component to a printed circuit board particularly to a board from which a chip has been removed and which board is warped.

It is another object of the present invention to provide an apparatus for forming solder joints between a chip or other such component and a printed circuit board particularly a printed circuit board which is being reworked and which is warped due to the rework process.

A further object of the invention is to provide reworked electronic assemblies having solder interconnections with enhanced mechanical and electrical integrity and reliability.

It is yet another object of the present invention to provide a chip and printed circuit board assembly made using the method and apparatus of the invention.

Other objects and advantages of the invention will be readily apparent from the description.

SUMMARY OF THE INVENTION

The above and other objects, which will be apparent to those skilled in the art, are achieved in the present invention which is directed in a first aspect to a nozzle device for attaching chips to a substrate and/or detaching chips or other components from a substrate such as a printed circuit board and particularly for reworking a printed circuit board to attach solder containing chips, i.e., ceramic ball grid array (CBGA) and column grid array solder structures, to the reworked board comprising:

a housing having an upper wall section enclosing an internal hot gas chamber and a lower wall section configured to hold a solder connection containing chip to be attached to corresponding solder connection sites on a substrate, e.g., a printed circuit board, and the housing having an open planar base which rests on the printed circuit board surface;

an inlet to the upper wall section for supplying hot gases to the housing;

a planar support member in the lower portion of the housing positioned above the base and forming a recessed area below the support member at the lower end of the housing for holding the chip in the housing parallel to the planar base, the support member having an upper surface and a lower surface and having a plurality of peripheral through openings communicating with the gas chamber and the recessed area so that hot gases from the hot gas chamber pass through the openings and contact the chip;

resilient means attached to the lower surface of the support member; and vacuum means extending through said housing and communicating with the chip within said recess area to hold the chip against the resilient member so that the lower portion of the solder connections extend preferably below the base of the housing;

wherein when the base of the nozzle containing the chip held therein by the vacuum means is placed on the printed circuit board, which board is positioned on a planar preferably heated surface, a pressure force is generated between the printed circuit board and chip so that the solder connections on the chip are pressed against the corresponding solder connection sites on the printed circuit board.

In a further aspect of the invention, a method for reworking a chip containing printed circuit board from which the chip has been removed and a new chip is to be attached thereto comprises the steps of:

supplying a nozzle comprising:

a housing having an upper wall section enclosing an internal hot gas chamber and a lower wall section configured to hold a solder connection containing chip to be attached to corresponding solder connection sites on a printed circuit board and the housing having an open planar base which rests on the printed circuit board surface;

an inlet to the upper wall section for supplying hot gases to the housing;

a planar support member in the lower portion of the housing positioned above the base and forming a recessed area below the support member at the lower end of the housing for holding the chip in the housing parallel to the planar base, the support member having an upper surface and a lower surface and having a plurality of peripheral through openings communicating with the gas chamber and the recessed area so that hot gases from the hot gas chamber pass through the openings and contact the chip;

resilient means attached to the lower surface of the support member; and vacuum means extending through said housing and communicating with the chip within said recess area to hold the chip against the resilient member and preferably compressing the resilient member so that the lower portion of the solder connections extend preferably below the base of the housing;

wherein when the base of the nozzle containing the chip held therein by the vacuum means is placed on a printed circuit board, which board is positioned on a planar preferably heated surface, a pressure force is generated between the printed circuit board and chip so that the solder connections on the chip are pressed against the corresponding solder connection sites on the printed circuit board;

placing a printed circuit board on a planar, preferably heated surface;

placing the nozzle containing chip on the surface of the printed circuit board so that the solder connections on the chip correspond to solder connection sites on the printed circuit board; and passing a heated gas through the nozzle melting the solder and forming a solder bond between the chip and printed circuit board.

In an additional aspect of the invention, chips may be secured to a printed circuit board or other such substrate and printed circuit boards may be reworked by removing and securing a new chip attached to a printed circuit board using the method and apparatus of the invention.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
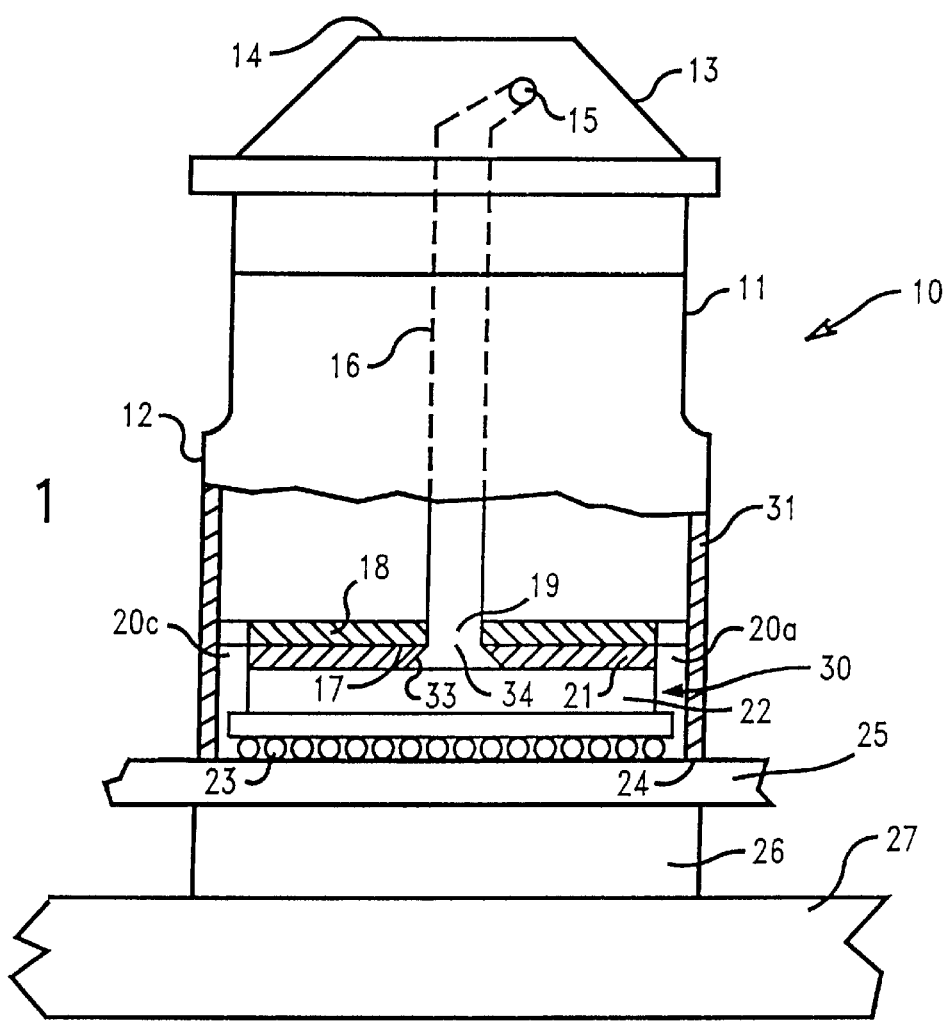
FIG. 1 is a side elevational partial cross-sectional view of a nozzle and apparatus of the invention.

In describing the preferred embodiment of the present invention, reference will be made herein to FIGS. 1–3 of the drawings in which like numerals refer to like features of the invention. Features of the invention are not necessarily shown to scale in the drawings.

Figure 3:
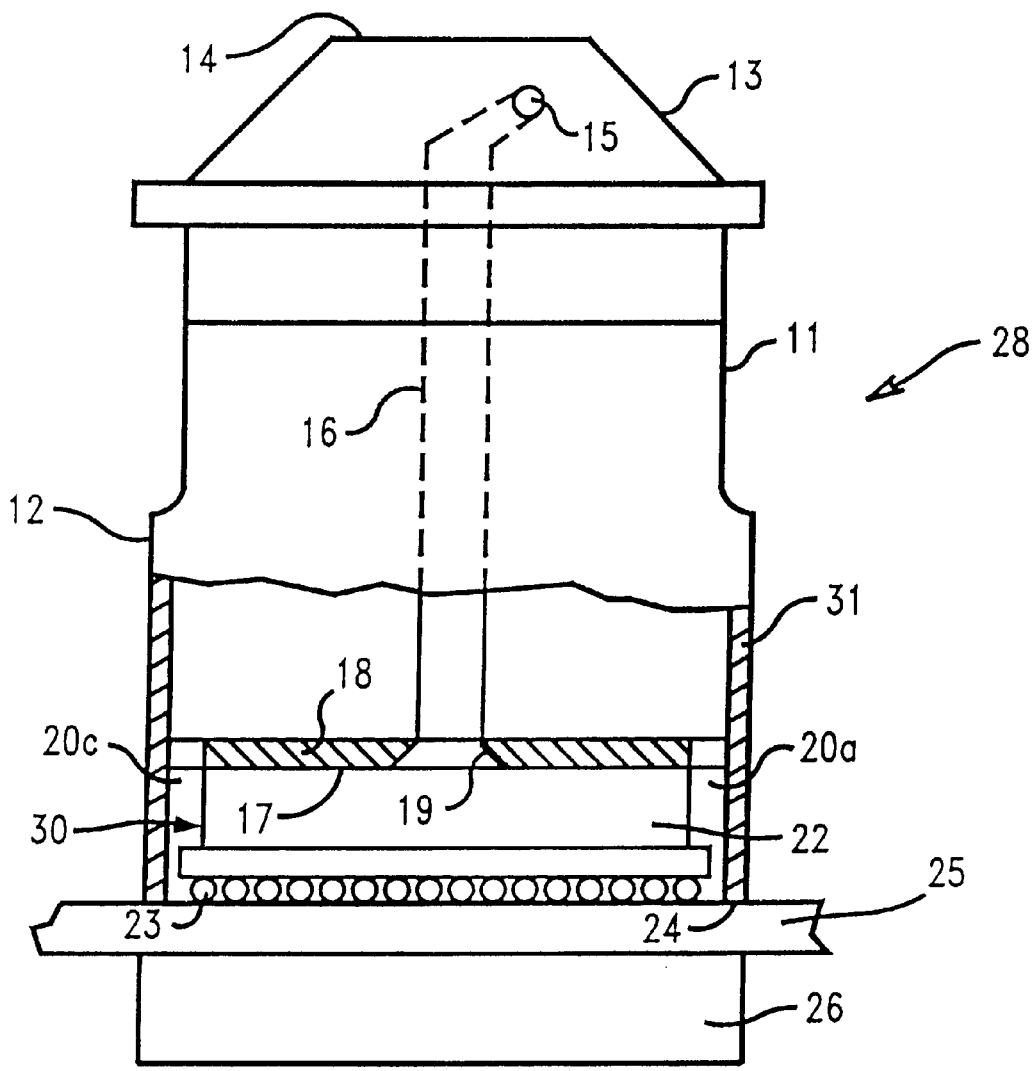
FIG. 3 is a side elevational partial cross-sectional view of a nozzle of the prior art.

Referring first to FIG. 3, a nozzle of the prior art is shown generally as 28. The nozzle comprises an upper portion 11 and a lower portion 12 both formed by walls 31 and having a base 24. At the upper end of the nozzle is a cap 13 which has an opening 14 which opening is typically inserted into a hot air or a hot gas apparatus for supplying hot gases to the nozzle 28. A vacuum tube 16 extends downwardly from an inlet 15 in the cap 13, typically centrally in the nozzle, to a chip support member 18. The support member is planar and typically in the shape of the lower portion of the housing and of the chip to be secured in the housing and extends preferably across the width of the nozzle to hold a chip in the nozzle in spatial parallel alignment to the base of the nozzle. The support member 18 has through openings 20 therein (two are shown as 20a and 20c) so hot gases entering the nozzle at 14 will flow downwardly through the nozzle housing and openings 20a and 20c into recess area 30 and contact the chip shown as 22. The chip 22 is shown positioned and its upper surface held against the lower surface 17 of support member 18 in recess area 30. To secure the chip, the support member 18 has an opening 19 communicating with the vacuum tube 16 so that the vacuum acts on the upper surface of chip 22 and holds chip 22 against the lower surface 17 of support member 18.

The chip 22 is shown having a plurality of solder bumps 23 on the lower surface thereof. The solder bumps will be reflowed and connected to a printed circuit board 25 by passing hot gases into and through the nozzle and openings 20 melting the solder bumps 23 which are held adjacent the printed circuit board during reflow connection of the chip to the printed circuit board. Accordingly, the printed circuit board will be placed against the base 24 of chip containing nozzle 28 and the hot gases passing through the nozzle melt (reflow) the solder bumps 23 and connect chip 22 to corresponding solder connection sites on the printed circuit board 25.

Referring now to FIG. 1 which shows a nozzle of the invention generally as 10, the nozzle has an upper portion 11 and a lower portion 12 both formed by walls 31. The cap 13 at the upper end of upper portion 11 has an opening 14 which is used to introduce hot gases into the nozzle. A vacuum tube 16 extends typically centrally through the nozzle 10 and has a vacuum inlet connection 15 in cap 13. The vacuum tube 16 is shown communicating with a support member 18 and resilient member 21 which is preferably affixed to support member 18 so that a vacuum applied to tube 16 will hold the upper surface of chip 22 against the lower surface 33 of resilient member 21.

The support member 18 extends across the width of nozzle 10 and has peripheral through openings 20 (two are shown as 20a and 20c) therein communicating with the lower end of the nozzle to allow hot gases to pass from the upper section 11 of the nozzle to a recess area 30 formed between the lower side 17 of the support member 18 and the base 24 of the nozzle. The support member 18 has a central opening 19 therein and the resilient member is also shown having an opening 34 therein both of which communicate with the vacuum tube 16 for providing a suction to hold chip 22 against lower surface 33 of the resilient member 21 and support member 18 in the nozzle. Typically the resilient member is a porous gas permeable type material as described below and an opening therein is not needed to provide a vacuum against the chip surface.

The chip 22 is shown having a plurality of solder bumps 23 on the lower surface thereof. A printed circuit board 25 is shown supported on a planar member 26. The planar member 26 may be any suitable material such as a plastic such as a polyimide, phenolic resin and the like and is shown positioned on a heating element 27.

It is an important aspect of the subject invention to use a resilient member 21 in the nozzle 10 between the upper surface of chip 22 and the lower surface 17 of support member 18. When the chip 22 is placed in the recess area 30 of the nozzle and a vacuum applied, the vacuum will force the chip 22 against the resilient member 21 and preferably compress the resilient member. At this compression or vacuum point, the lower end of the solder bumps 23 will preferably be slightly below the base 24 of nozzle 10. In this position, when the base 24 of the nozzle containing the chip 22 is placed against the printed circuit board 25, a slight pressure is exerted on the solder connection sites of the printed circuit board 25 by the solder bumps 23 of chip 22 and resilient member 21. This pressure coupled with heat from the hot gas supply and the heated planar surface 26 on which the printed circuit board 25 rests, enables reflow connection of the chip 22 to the printed circuit board even if the board is warped. A heating member is shown as 27.

Figure 2:
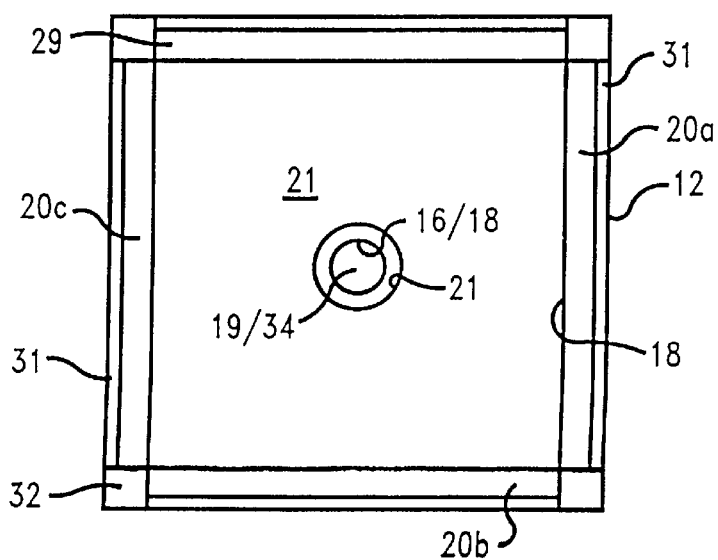
FIG. 2 is a bottom plan view of the nozzle of FIG. 1.

FIG. 2 is a bottom plan view of the nozzle of the invention shown in FIG. 1. The lower portion 12 of the nozzle has a square base (to hold a square chip) formed by walls 31 and corner supports 32. The support member 18 (not shown—resilient member 21 is shown) is configured to provide openings 20a, 20b and 20c which run the length of the walls 31 between the housing walls 31 and the outer edges of support member 18 (which in this configuration is the same size as resilient member 21). The hot gases pass through openings 20a, 20b and 20c and travel past the chip as shown in FIG. 1. Vent 29 allows exiting of gases from the nozzle. Vacuum tube 16 communicates with openings 19 and 34 in the support member 18 and resilient member 21 to hold the chip 22 against the resilient means as shown in FIG. 1.

The resilient member 21 may be made of any suitable material which is compressed when a force is applied thereto and which decompresses essentially to its uncompressed state when the force is removed. Accordingly, it will be appreciated to those skilled in the art, that the resilient member when in a state of decompression, is biased to the uncompressed state and therefore exerts a pressure force in the direction of the uncompressed position. A suitable resilient material is silicon rubber, other type rubbers and similar materials. The thickness of the resilient material may vary widely and is preferably about 0.0525 inch to 0.0535 inch because of its demonstrated effectiveness. The thickness is correlated to the size of the recess area, chip thickness, desired pressure force to be applied, etc. Springs or other resilient type devices may also be employed.

In using the nozzle in the method of the invention, a chip 22 is positioned in the recess area 30 of nozzle 10 and a vacuum applied through vacuum tube 16 to preferably compress the resilient member 21 and hold the chip in the nozzle against the compressed resilient member. The base of the nozzle is then placed on top of a printed circuit board which is positioned on a heated flat planar surface. The printed circuit board is preferably pre-heated to a temperature above 90° C., generally about 100° C. After the nozzle and printed circuit board are in place, i.e., the solder bumps on the chip are positioned against corresponding solder connection sites on the board so that the solder bumps and printed circuit board are in compression, hot gases are provided to the nozzle through opening 14 and the gases circulate through openings 20a, 20b and 20c around solder bumps 23. Gases typically vent the nozzle through an opening such as 29 shown in FIG. 2. The solder bumps 23 melt (reflow) and join to corresponding pads on the printed circuit board 25. Hot gases to the nozzle are then stopped and the printed circuit board cooled to solidify the joint between the chip 22 and printed circuit board 25.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A nozzle device for attaching chips to a substrate and/or detaching chips or other components from a substrate comprising:
   a housing having an upper wall section enclosing an internal hot gas chamber and a lower wall section configured to hold a solder connection containing chip to be attached to corresponding solder connection sites on a substrate and the housing having an open planar base which rests on the substrate surface;
   an inlet to the upper wall section for supplying hot gases to the housing;
   a planar support member in the lower portion of the housing positioned above the base and forming a recessed area below the support member at the lower end of the housing for holding the chip in the housing parallel to the planar base, the support member having an upper surface and a lower surface and having a plurality of peripheral through openings communicating with the gas chamber and the recessed area so that hot gases from the hot gas chamber pass through the openings and contact the chip;
   resilient member means attached to the lower surface of the support member and covering the lower surface of the support member; and
   vacuum means extending through said housing and communicating with the chip within said recess area wherein the vacuum holds the chip against the resilient member so that the resilient member is compressed and the lower portion of the solder connections extend below the base of the housing;
   wherein when the base of the nozzle containing the chip held therein by the vacuum means is placed on the substrate which substrate is positioned on a planar surface, a resilient pressure force is generated between the substrate and chip so that the solder connections on the chip are pressed against the corresponding solder connection sites on the substrate.

2. The nozzle device of claim 1 wherein the planar support member contains heating means.

3. The nozzle device of claim 2 further containing a heating member on which the planar surface is positioned.

4. A method for reworking a chip containing printed circuit board comprises the steps of:
   supplying a nozzle comprising:
      a housing having an upper wall section enclosing an internal hot gas chamber and a lower wall section configured to hold a solder connection containing chip to be attached to corresponding solder connection sites on a printed circuit board and the housing having an open planar base which rests on the printed circuit board surface;
      an inlet to the upper wall section for supplying hot gases to the housing;
      a planar support member in the lower portion of the housing positioned above the base and forming a recessed area below the support member at the lower end of the housing for holding the chip in the housing parallel to the planar base, the support member having a an upper surface and a lower surface and having a plurality of peripheral through openings communicating with the gas chamber and the recessed area so that hot gases from the hot gas chamber pass through the openings and contact the chip;
      resilient member means attached to the lower surface of the support member and covering the lower surface of the support member; and
      vacuum means extending through said housing and communicating with the chip within said recess area wherein the vacuum holds the chip against the resilient member so that the resilient member is compressed and the lower portion of the solder connections extend below the base of the housing;
      wherein when the base of the nozzle containing the chip held therein by the vacuum means is placed on a printed circuit board which board is positioned on a planar surface, a resilient pressure force is generated between the printed circuit board and chip so that the solder connections on the chip are pressed against the corresponding solder connection sites on the printed circuit board;
   placing a printed circuit board on a planar surface;
   placing the nozzle containing chip on the surface of the printed circuit board so that the solder connections on the chip correspond to solder connection sites on the printed circuit board; and
   passing a heated gas through the nozzle melting the solder and forming a solder bond between the chip and printed circuit board.

5. The method of claim 4 wherein the solder connections of the chip are a ball grid array or a column grid array.

6. The method of claim 5 wherein the planar surface is heated.

7. The method of claim 6 further comprising placing the planar surface on a heating member.

* * * * *